US012807774B2

(12) United States Patent
Liu et al.

(10) Patent No.: US 12,807,774 B2
(45) Date of Patent: Nov. 24, 2026

(54) POLYISOCYANURATE-PREPREGS AND FIBER COMPOSITE COMPONENTS PRODUCED THEREFROM

(71) Applicant: Covestro Deutschland AG, Leverkusen (DE)

(72) Inventors: Xingchen Liu, Shanghai (CN); Yan Deng, Shanghai (CN); Qing Yu, Shanghai (CN); Jingmei Liu, Shanghai (CN); Min Tang, Shanghai (CN); Weixi Lu, Shanghai (CN); Ruqi Chen, Shanghai (CN); Andreas Hecking, Langenfeld (DE); Bianca Rexmann, Leverkusen (DE)

(73) Assignee: Covestro Deutschland AG, Leverkusen (DE)

(*) Notice: Subject to any disclaimer, the term of this patent is extended or adjusted under 35 U.S.C. 154(b) by 446 days.

(21) Appl. No.: 18/551,044

(22) PCT Filed: Mar. 28, 2022

(86) PCT No.: PCT/EP2022/058061

§ 371 (c)(1),
(2) Date: Sep. 18, 2023

(87) PCT Pub. No.: WO2022/207532

PCT Pub. Date: Oct. 6, 2022

(65) Prior Publication Data

US 2024/0301154 A1 Sep. 12, 2024

(30) Foreign Application Priority Data

Mar. 29, 2021 (WO) ................ PCT/CN2021/083529
Apr. 28, 2021 (EP) .................................... 21171053

(51) Int. Cl.

| | |
|---|---|
| ***C08J 5/24*** | (2006.01) |
| ***B32B 5/26*** | (2006.01) |
| ***B32B 15/14*** | (2006.01) |
| ***B32B 15/20*** | (2006.01) |
| ***B32B 17/02*** | (2006.01) |
| ***C08G 18/02*** | (2006.01) |
| ***C08G 18/09*** | (2006.01) |
| ***C08G 18/18*** | (2006.01) |
| ***C08G 18/72*** | (2006.01) |
| ***C08G 18/73*** | (2006.01) |
| ***C08G 18/78*** | (2006.01) |
| ***C08G 18/79*** | (2006.01) |
| ***H05K 1/03*** | (2006.01) |

(52) U.S. Cl.

CPC ................. *C08J 5/244* (2021.05); *B32B 5/26* (2013.01); *B32B 15/14* (2013.01); *B32B 15/20* (2013.01); *B32B 17/02* (2013.01); *C08G 18/022* (2013.01); *C08G 18/092* (2013.01); *C08G 18/1825* (2013.01); *C08G 18/721* (2013.01); *C08G 18/73* (2013.01); *C08G 18/7887* (2013.01); *C08G 18/792* (2013.01); *C08G 18/794* (2013.01); *B32B 2250/05* (2013.01); *B32B 2260/023* (2013.01); *B32B 2260/046* (2013.01); *B32B 2262/101* (2013.01); *B32B 2457/08* (2013.01); *C08J 2375/00* (2013.01); *C08J 2475/00* (2013.01); *H05K 1/0346* (2013.01); *H05K 1/0366* (2013.01)

(58) Field of Classification Search

CPC .... C08J 5/244; C08J 2375/00; C08J 2475/00; C08G 18/1825; C08G 18/73; C08G 18/792; C08G 18/794; C08G 18/022; C08G 18/092; C08G 18/721; C08G 18/7887; H05K 1/0366; H05K 1/0346; B32B 2250/05; B32B 2260/023; B32B 2260/046; B32B 2262/101; B32B 2457/08; B32B 5/26; B32B 15/14; B32B 15/20; B32B 17/02

See application file for complete search history.

(56) References Cited

U.S. PATENT DOCUMENTS

| | | | |
|---|---|---|---|
| 3,487,080 | A | 12/1969 | Yutaka et al. |
| 3,996,223 | A | 12/1976 | Gupta et al. |
| 4,040,992 | A | 8/1977 | Bechara et al. |
| 4,255,569 | A | 3/1981 | Mueller et al. |
| 4,265,798 | A | 5/1981 | Mishra |
| 4,379,905 | A | 4/1983 | Stemmler et al. |
| 4,419,513 | A | 12/1983 | Breidenbach et al. |
| 4,487,928 | A | 12/1984 | Richter et al. |
| 4,499,253 | A | 2/1985 | Kerimis et al. |
| 4,604,418 | A | 8/1986 | Shindo et al. |
| 4,724,250 | A | 2/1988 | Schubert et al. |

(Continued)

FOREIGN PATENT DOCUMENTS

| | | | |
|---|---|---|---|
| CN | 104379623 | A | 2/2015 |
| DE | 1954093 | A1 | 6/1970 |

(Continued)

OTHER PUBLICATIONS

Laas et al., J. Prakt. Chem. Vol. 336, Issue 3, (1994) pp. 185-200.

(Continued)

*Primary Examiner* — Rabon A Sergent

(74) *Attorney, Agent, or Firm* — Donald R. Palladino

(57) ABSTRACT

The present invention relates to polyisocyanate compositions comprising two different types of polyisocyanate, their use in the manufacture of prepregs and polyisocyanurate composites made from said prepregs.

17 Claims, No Drawings

(56) References Cited

U.S. PATENT DOCUMENTS

| | | | | |
|---|---|---|---|---|
| 4,780,484 | A | 10/1988 | Schubert et al. | |
| 4,789,705 | A | 12/1988 | Kase et al. | |
| 4,837,359 | A | 6/1989 | Woynar et al. | |
| 4,960,848 | A | 10/1990 | Scholl et al. | |
| 4,994,541 | A | 2/1991 | Dell et al. | |
| 5,013,838 | A | 5/1991 | Scholl | |
| 5,064,960 | A | 11/1991 | Pedain et al. | |
| 5,076,958 | A | 12/1991 | Pedain et al. | |
| 5,489,663 | A | 2/1996 | Brandt et al. | |
| 5,914,383 | A | 6/1999 | Richter et al. | |
| 6,090,939 | A | 7/2000 | Richter et al. | |
| 6,107,484 | A | 8/2000 | Richter et al. | |
| 8,119,799 | B2 | 2/2012 | Binder et al. | |
| 8,455,090 | B2 | 6/2013 | Schmidt et al. | |
| 8,742,166 | B2 | 6/2014 | Lucas et al. | |
| 9,399,705 | B2 | 7/2016 | Hupka et al. | |
| 9,926,402 | B2 | 3/2018 | Laas et al. | |
| 10,029,427 | B2 | 7/2018 | Schmidt et al. | |
| 10,590,226 | B2 | 3/2020 | Matner et al. | |
| 10,597,484 | B2 | 3/2020 | Achten et al. | |
| 11,286,387 | B2 | 3/2022 | Beisele et al. | |
| 2005/0080259 | A1 | 4/2005 | Revelant et al. | |
| 2006/0155095 | A1 | 7/2006 | Daussin et al. | |
| 2015/0158967 | A1* | 6/2015 | Esbelin .................. | C08G 18/72 252/183.11 |
| 2017/0306116 | A1 | 10/2017 | Schornstein et al. | |
| 2018/0079855 | A1 | 3/2018 | Matner et al. | |
| 2019/0144592 | A1 | 5/2019 | Hocke et al. | |
| 2019/0233574 | A1 | 8/2019 | Boehnke et al. | |
| 2021/0155747 | A1* | 5/2021 | Meisenheimer ..... | C08G 18/792 |
| 2021/0246255 | A1 | 8/2021 | Hocke et al. | |
| 2021/0388148 | A1 | 12/2021 | Chen et al. | |
| 2022/0041792 | A1 | 2/2022 | Meisenheimer et al. | |

FOREIGN PATENT DOCUMENTS

| | | | | |
|---|---|---|---|---|
| DE | 1670666 | A1 | 7/1971 | |
| DE | 2414413 | A1 | 10/1975 | |
| DE | 3240613 | A1 | 5/1984 | |
| EP | 0013880 | A1 | 8/1980 | |
| EP | 0100129 | A1 | 2/1984 | |
| EP | 0443167 | A1 | 8/1991 | |
| EP | 0671426 | A1 | 9/1995 | |
| EP | 0896009 | A1 | 2/1999 | |
| EP | 0981427 | B1 | 8/2007 | |
| GB | 809809 | A | 3/1959 | |
| GB | 1386399 | A | 3/1975 | |
| GB | 1391066 | A | 4/1975 | |
| GB | 2222161 | A | 2/1990 | |
| JP | S5959716 | A | 4/1984 | |
| WO | 2016170059 | A1 | 10/2016 | |
| WO | 2018087395 | A1 | 5/2018 | |
| WO | WO-2019197638 | A1 * | 10/2019 | ......... C08G 18/1841 |
| WO | WO-2019197639 | A1 * | 10/2019 | ......... C08G 18/1825 |
| WO | 2020123640 | A1 | 6/2020 | |
| WO | WO-2020152107 | A1 * | 7/2020 | ............. C08G 18/73 |
| WO | 2020262512 | A1 | 12/2020 | |
| WO | 2021081154 | A1 | 4/2021 | |

OTHER PUBLICATIONS

S. Cinnamon et al., European Polymer Journal, vol. 16, (1979) pp. 147-148.

J. H. Saunders and K.C. Frisch, Polyurethanes Chemistry and Technology, (1962) pp. 94 ff.

International Search Report, PCT/EP2022/058061, date of mailing: Jun. 13, 2022, Authorized officer: Sandra Lanz.

* cited by examiner

POLYISOCYANURATE-PREPREGS AND FIBER COMPOSITE COMPONENTS PRODUCED THEREFROM

CROSS-REFERENCE TO RELATED APPLICATIONS

This application is a national stage application under 35 U.S.C. 371 of PCT/EP2022/058061, filed Mar. 28, 2022, which claims the benefit of European application no. 21171053.8, filed Apr. 28, 2021, and also International Application No. PCT/CN2021/083529, filed Mar. 29, 2021, each of which is incorporated herein by reference.

BACKGROUND

The present invention relates to polyisocyanate compositions comprising two different types of polyisocyanate, their use in the manufacture of prepregs and polyisocyanurate composites made from said prepregs.

Composite materials reinforced with fibers such as carbon fibers or glass fibers have been receiving attention because of their characteristics, i.e., good heat resistance and good mechanical strength despite their lightness. They have been more widely used in various structural applications such as printed circuit boards, chassis, and various members of auto-mobiles and aircrafts. A frequently used method for molding such a fiber-reinforced resin composite material employs an intermediate material called a prepreg. In a prepreg reinforcing fibers are impregnated with a thermosetting resin. The impregnated fibers are then cured and molded by autoclave molding or press molding.

Typically, resins for prepregs are required to have both storage stability even at room temperature and curability by heating or the like. An additional desired feature is possibility of cutting the prepregs to size, without the cutting tools becoming contaminated with the often sticky matrix material. In general, thermosetting resins such as epoxy resin compositions have often been used. Prepregs containing epoxy resins, however, disadvantageously need to be stored at low temperatures because curing already proceeds at normal temperature. Prepregs and composite components produced therefrom, based on epoxy systems, are described e.g. in EP 0981427.

In the last few years, there has also been development of polyurethane-based prepregs which feature storage stability at room temperature. Unlike prepregs based on epoxy resins, storage-stable PU prepregs need not be cooled in a costly manner prior to processing. In DE 10200900193.3 and DE 102009001806.9, a process is described for the production of storage-stable prepregs, essentially made up of A) at least one fibrous support and B) at least one reactive polyurethane composition in powder form as the matrix material.

One of the biggest application areas for epoxy-based prepreg is for manufacturing a copper clad laminate (CCL) and printed circuit boards (PCBs). Although the above-mentioned polyurethane-based prepreg can solve the issue of storage-stability of prepregs, their dielectric properties cannot satisfy the comprehensive requirements for high-frequency signal transmission due to the higher dielectric constants (Dk), and dissipation factors (Df). This is due to the large amount of polar urethane groups in the final cured resin. Particularly in the high frequency (2 GHz and greater) communication field of radio frequency base stations, radar antennas and the like, it sets up higher requirements for signal transmission loss and signal transmission delay. Another barrier for the polyurethane prepreg application for PCBs is their low heat resistance, the glass transition temperature for a PU-based prepreg reported e.g. in WO 2012/038105 is only with Tg at ca. 70 °C, and in WO 2013/139704, the Tg of the final cured resin is 146 °C which are both too low to meet the requirement of PCB of normally more than 150 °C.

DETAILED DESCRIPTION OF THE INVENTION

The object of the present invention is to provide prepregs which can be produced by means of a simple process and are storage-stable at room temperatures for a plurality of weeks. The prepregs are moreover intended to be almost tack-free, so that they can easily be further processed. A further object of the invention is to provide a resin composition that can achieve a printed circuit board having a low dielectric property and a high glass transition temperature.

Polyisocyanurate materials based on a dual curing mechanism have been described. WO 2018/087395 discloses a combination of acrylates and polyisocyanates so that two different crosslinking mechanisms are available which can be activated by different mechanisms, ionizing radiation and heat. WO 2020/152107 discloses the use of polyisocyanates with small proportions of polyols or polyamines. In the first step, urethane or urea groups are formed by a first catalyst at a lower temperature. This reaction is limited by the number of available amine or hydroxyl groups. In a second step higher temperatures are used to form isocyanurate groups from the remaining isocyanate groups.

Both mechanisms can be used to provide prepregs. However, in both cases it must be accepted that the resulting material comprises relevant amounts of crosslinking groups other than the isocyanurate group. Depending on the application this may be undesirable as the isocyanurate group has particularly advantageous properties.

Thus, the problem underlying the present invention is the provision of a dual curing mechanism which allows the manufacture of polyisocyanurate plastics in two different curing steps so that a storage-stable semi-finished product can be obtained in a first curing step and be fully cured in a second one.

This problem is solved by the embodiments defined in the claims and in the description below.

In a first embodiment, the present invention relates to a polymerizable composition which is free from isocyanate-reactive groups or has or a molar ratio of isocyanate groups of the isocyanate component to isocyanate-reactive groups of at least 2.0:1.0 comprising a) at least one aliphatic polyisocyanate;

b) at least one cycloaliphatic polyisocyanate; and c) at least one trimerization catalyst;

wherein the concentration of cycloaliphatic polyisocyanates is 25 wt.-% to 75 wt.-% based on the total mass of all polyisocyanates present in the polymerizable composition; and wherein, the concentration of uretdione-forming catalysts in the composition is not more than 10 wt.-% of the total mass of uretdione-forming catalysts and trimerization catalysts present in the polymerizable composition.

A "polymerizable composition" is a composition which comprises the components defined above optionally further components set out below. In a "polymerizable composition" said components are mixed in such a way that the composition can be used to form a polymer by simple heating.

The polymerizable composition of the present invention is particularly suitable for the manufacture of prepreg materials. Prepreg materials are materials comprising thermoset polymer which has been partially cured so that the material can be handled or transported. However, the curing during the manufacture of the prepreg must not proceed to a point, where the material becomes too hard and brittle to be worked with, e.g. by bending. In the polymerizable composition of the present invention this is achieved by the combination of at least two different polyisocyanates having a different reactivity. Thus, a first curing step at lower temperatures creates the prepreg mainly by crosslinking the isocyanate group of the more reactive polyisocyanate and a second curing step can then be used to obtain a hard and fully cured material which is fit for the intended use. Of the polyisocyanates recited above, aromatic polyisocyanates have the highest reactivity, araliphatic polyisocyanate have the second highest reactivity, aliphatic polyisocyanates have the second lowest reactivity and cycloaliphatic polyisocyanates are the least reactive species. Thus, in order to achieve a dual cure mechanism as desired by the present invention, the aliphatic polyisocyanate has to be paired with at least one polyisocyanate having a different reactivity. Species which fulfill this requirements are cycloaliphatic, aromatic and araliphatic polyisocyanates. If the combination of the aliphatic polyisocyanate with a slower curing species is desired, it should be mixed with at least one cycloaliphatic polyisocyanate. If the combination of the aliphatic polyisocyanate with a faster curing species is desired, it should be mixed with at least one araliphatic and/or aromatic polyisocyanate. It is also possible to combine the aliphatic polyisocyanate with both a faster curing and a slower curing polyisocyanate. In a preferred embodiment of the present invention, the polymerizable composition comprises at least one aliphatic polyisocyanate and at least one cycloaliphatic polyisocyanate.

It is preferred that the at least one aliphatic polyisocyanate makes up 10 wt.-% to 80 wt.-%, preferably 25 wt.-% to 65 wt.-% of the total amount of all polyisocyanates present in the polymerizable composition.

The preferred content of cycloaliphatic polyisocyanates is 25 wt.-% to 75 wt.-%, more preferably 30 wt.-% to 70 wt.-%.

In a preferred embodiment of the present invention araliphatic and aromatic polyisocyanates make up not more than 10 wt.-%, more preferably not more than 5 wt.-% of the total amount of all polyisocyanates present in the polymerizable composition. Most preferably, the polymerizable composition is free from the aforementioned polyisocyanates.

The polymer obtainable by polymerizing the polymerizable composition of the invention receives its advantageous properties very substantially through crosslinking of the isocyanate groups with one another. Consequently, it is essential to the invention that the ratio of isocyanate groups to the total amount of the isocyanate-reactive groups in the polymerizable composition is restricted such that there is a distinct molar excess of isocyanate groups. The molar ratio of isocyanate groups of the isocyanate component to isocyanate-reactive groups in the reactive resin is consequently at least 2.0:1.0, preferably at least 3.0:1.0, more preferably at least 4.0:1.0 and even more preferably at least 8.0:1.0. The composition may also be free from isocyanate-reactive groups. "Isocyanate-reactive groups" in the context of the present application are hydroxyl, thiol, carboxyl and amino groups, amides, urethanes, acid anhydrides and epoxides.

In a preferred embodiment of the present invention, the polymerizable composition additionally comprises at least on organic solvent which does not contain isocyanate-reactive groups, also referred to as "inert solvent". Preferably the concentration of this solvent is such that the viscosity of the polymerizable composition is between 100 mPas and 2,000 mPas. Typically, such values are achieved if the polymerizable composition preferably comprises 10 wt.-% to 50 wt.-% inert solvent based on the sum of all polyisocyanates, all trimerization catalysts and all solvents.

In another preferred embodiment of the present invention the polymerizable composition additionally comprises an organic or inorganic filler.

The term "polyisocyanate" as used here is a collective term for compounds containing two or more isocyanate groups in the molecule (this is understood by the person skilled in the art to mean free isocyanate groups of the general structure —N═C═O). The simplest and most important representatives of these polyisocyanates are the diisocyanates. These have the general structure O═C═N—R—N═C═O where R typically represents aliphatic, alicyclic and/or aromatic radicals. A "polyisocyanate component" refers to the totality of all polyisocyanates belonging to this species. Thus, the "aliphatic polyisocyanate component" refers to the sum of all aliphatic polyisocyanates present in the polymerizable composition, the term "aromatic polyisocyanate component" refers to all aromatic polyisocyanates and the term "cycloaliphatic polyisocyanate component" refers to the sum of all cycloaliphatic polyisocyanates.

Because of the polyfunctionality (≥2 isocyanate groups), it is possible to use polyisocyanates to produce a multitude of polymers (e.g. polyurethanes, polyureas and polyisocyanurates) and low molecular weight compounds (for example those having uretdione, isocyanurate, allophanate, biuret, iminooxadiazinedione and/or oxadiazinetrione structure).

The term "polyisocyanates" in this application refers equally to monomeric and/or oligomeric polyisocyanates. For the understanding of many aspects of the invention, however, it is important to distinguish between monomeric diisocyanates and oligomeric polyisocyanates. Where reference is made in this application to "oligomeric polyisocyanates", this means polyisocyanates formed from at least two monomeric diisocyanate molecules, i.e. compounds that constitute or contain a reaction product formed from at least two monomeric diisocyanate molecules.

The preparation of oligomeric polyisocyanates from monomeric diisocyanates is also referred to here as modification of monomeric diisocyanates. This "modification" as used here means the reaction of monomeric diisocyanates to give oligomeric polyisocyanates having uretdione, isocyanurate, allophanate, biuret, iminooxadiazinedione and/or oxadiazinetrione structure.

For example, hexamethylene diisocyanate (HDI) is a "monomeric diisocyanate" since it contains two isocyanate groups and is not a reaction product of at least two polyisocyanate molecules:

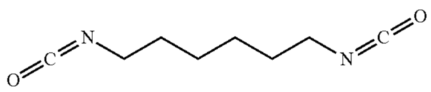

HDI

Reaction products which are formed from at least two HDI molecules and still have at least two isocyanate groups, by contrast, are "oligomeric polyisocyanates" within the context of the invention. Representatives of such "oligomeric polyisocyanates" are, proceeding from monomeric HDI, for example, HDI isocyanurate and HDI biuret, each of which is formed from three monomeric HDI units:

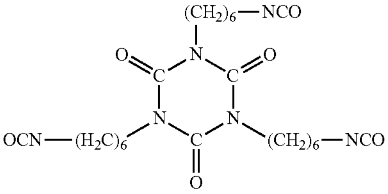

HDI isocyanurate

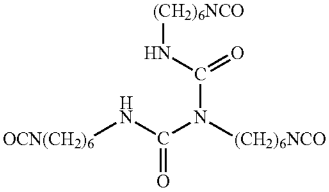

HDI biuret (idealized structural formulae)

According to the invention, the proportion of isocyanate groups based on the total amount of the all polyisocyanates present in the polymerizable composition is at least 15% by weight.

In principle, monomeric and oligomeric polyisocyanates are equally suitable for use in the present invention. Consequently, any polyisocyanate may consist essentially of monomeric polyisocyanates or essentially of oligomeric polyisocyanates. It may alternatively comprise oligomeric and monomeric polyisocyanates in any desired mixing ratios.

However, in a preferred embodiment of the invention, the polyisocyanates used as reactants in the trimerization have a low level of monomers (i.e. a low level of monomeric diisocyanates) and already contain oligomeric polyisocyanates. If the monomer content of the polyisocyanate composition is too high, the first curing step does not result in a storage stable semi-finished product. The expressions "having a low level of monomers" and "having a low level of monomeric diisocyanates" are used here synonymously.

Results of particular practical relevance are established when a polyisocyanate has a proportion of monomeric diisocyanates of not more than 20% by weight, especially not more than 15% by weight or not more than 10% by weight, based in each case on the weight of the respective polyisocyanate. Preferably, a polyisocyanate has a content of monomeric diisocyanates of not more than 5% by weight, preferably not more than 2.0% by weight, more preferably not more than 1.0% by weight, based in each case on the weight of the respective polyisocyanate. Particularly good results are established when the polyisocyanate is essentially free of monomeric diisocyanates. "Essentially free" here means that the content of monomeric diisocyanates is not more than 0.5% by weight, based on the weight of the polyisocyanate.

In a particularly preferred embodiment of the invention, each isocyanate consists entirely or to an extent of at least 80%, 85%, 90%, 95%, 98%, 99% or 99.5% by weight, based in each case on the weight of the respective polyisocyanate, of oligomeric polyisocyanates. Preference is given here to a content of oligomeric polyisocyanates of at least 99% by weight. This content of oligomeric polyisocyanates relates to the polyisocyanate as provided. In other words, the oligomeric polyisocyanates are not formed as intermediate during any process of the invention, but are already present in the polymerizable composition on commencement of any reaction.

Polyisocyanate compositions which have a low level of monomers or are essentially free of monomeric isocyanates can be obtained by conducting, after the actual modification reaction, in each case, at least one further process step for removal of the unconverted excess monomeric diisocyanates. This removal of monomers can be effected in a particularly practical manner by processes known per se, preferably by thin-film distillation under high vacuum or by extraction with suitable solvents that are inert toward isocyanate groups, for example aliphatic or cycloaliphatic hydrocarbons such as pentane, hexane, heptane, cyclopentane or cyclohexane.

In a preferred embodiment of the invention, the polyisocyanate components of the invention are obtained by modifying monomeric diisocyanates with subsequent removal of unconverted monomers.

The oligomeric polyisocyanates may, in accordance with the invention, especially have uretdione, isocyanurate, allophanate, biuret, iminooxadiazinedione and/or oxadiazinetrione structure. In one embodiment of the invention, the oligomeric polyisocyanates have at least one of the following oligomeric structure types or mixtures thereof:

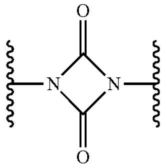

Uretdione

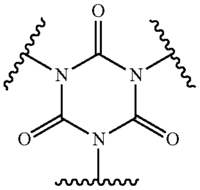

Isocyanurate

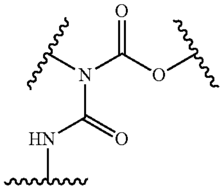

Allophanate

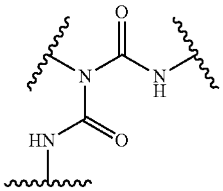

Biuret

-continued

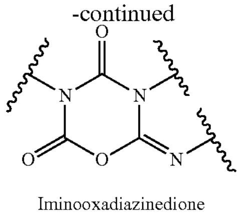

Iminooxadiazinedione

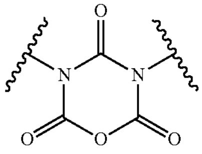

Oxadiazinetrione

In a preferred embodiment of the invention, an aliphatic polyisocyanate component is used, wherein the isocyanurate structure content of this component is at least 50 mol-%, preferably at least 60 mol-%, more preferably at least 70 mol-%, even more preferably at least 80 mol-%, even more preferably still at least 90 mol-% and especially preferably at least 95 mol-%, based on the sum total of the oligomeric structures from the group consisting of uretdione, isocyanurate, allophanate, biuret, iminooxadiazinedione and oxadiazinetrione structure present in the aliphatic polyisocyanate component.

If a cycloaliphatic polyisocyanate component is present, it is also preferred that it has an isocyanurate structure content of at least 50 mol-%, preferably at least 60 mol-%, more preferably at least 70 mol-%, even more preferably at least 80 mol-%, even more preferably still at least 90 mol-% and especially preferably at least 95 mol-%, based on the sum total of the oligomeric structures from the group consisting of uretdione, isocyanurate, allophanate, biuret, iminooxadiazinedione and oxadiazinetrione structure present in the cycloaliphatic polyisocyanate component.

It has been found out in the study underlying the present invention that the use of oligomeric polyisocyanates with a content of isocyanurate groups improves the heat resistance of the end product.

The proportions of uretdione, isocyanurate, allophanate, biuret, iminooxadiazinedione and/or oxadiazinetrione structure in a polyisocyanate can be determined, for example, by NMR spectroscopy. It is possible here with preference to use 13C NMR spectroscopy, preferably in proton-decoupled form, since the oligomeric structures mentioned give characteristic signals.

Irrespective of the underlying oligomeric structure (uretdione, isocyanurate, allophanate, biuret, iminooxadiazinedione and/or oxadiazinetrione structure), an oligomeric polyisocyanate for use in the present invention preferably has an (average) NCO functionality of 2.0 to 5.0, preferably of 2.3 to 4.5.

Results of particular practical relevance are established when the respective polyisocyanates to be used in accordance with the invention have a content of isocyanate groups of 8.0% to 28.0% by weight, preferably of 14.0% to 25.0% by weight, based in each case on the weight of the respective polyisocyanate.

Preparation processes for the oligomeric polyisocyanates having uretdione, isocyanurate, allophanate, biuret, iminooxadiazinedione and/or oxadiazinetrione structure that are to be used in accordance with the invention are described, for example, in J. Prakt. Chem. 336 (1994) 185-200, in DE-A 1 670 666, DE-A 1 954 093, DE-A 2 414 413, DE-A 2 452 532, DE-A 2 641 380, DE-A 3 700 209, DE-A 3 900 053 and DE-A 3 928 503 or in EP-A 0 336 205, EP-A 0 339 396 and EP-A 0 798 299.

As the advantageous effects of the present invention require the presence of different species of polyisocyanates, these species are defined in further detail below.

Aliphatic Polyisocyanates

In an aliphatic polyisocyanate all isocyanate groups are bonded to a carbon atom that is part of an open carbon chain. This may be unsaturated at one or more sites. The aliphatically bonded isocyanate groups are preferably bonded at the terminal carbon atoms of the carbon chain.

Aliphatic polyisocyanates that are particularly suitable according to the invention are 1,4-diisocyanatobutane (BDI), 1,5-diisocyanatopentane (PDI), 1,6-diisocyanatohexane (HDI), 2-methyl-1,5-diisocyanatopentane, 1,5-diisocyanato-2,2-dimethylpentane, 2,2,4- or 2,4,4-trimethyl-1,6-diisocyanatohexane and 1,10-diisocyanatodecane and oligomers derived therefrom.

Cycloaliphatic Polyisocyanates

In a cycloaliphatic polyisocyanate all isocyanate groups are bonded to carbon atoms which are part of a closed ring of carbon atoms. This ring may be unsaturated at one or more sites provided that it does not attain aromatic character as a result of the presence of double bonds.

Cycloaliphatic polyisocyanates that are particularly suitable according to the invention are 1,3- and 1,4-diisocyanatocyclohexane, 1,4-diisocyanato-3,3,5-trimethylcyclohexane, 1,3-diisocyanato-2-methylcyclohexane, 1,3-diisocyanato-4-methylcyclohexane, 1-isocyanato-3,3,5-trimethyl-5-isocyanatomethylcyclohexane (isophorone diisocyanate; IPDI), 1-isocyanato-1-methyl-4(3)-isocyanatomethylcyclohexane, 2,4'- and 4,4'-diisocyanatodicyclohexylmethane (H12MDI), 1,3- and 1,4-bis(isocyanatomethyl)cyclohexane, bis(isocyanatomethyl)norbornane (NBDI), 4,4'-diisocyanato-3,3'-dimethyldicyclohexylmethane, 4,4'-diisocyanato-3,3',5,5'-tetramethyldicyclohexylmethane, 4,4'-diisocyanato-1,1'-bi(cyclohexyl), 4,4'-diisocyanato-3,3'-dimethyl-1,1'-bi(cyclohexyl), 4,4'-diisocyanato-2,2',5,5'-tetramethyl-1,1'-bi(cyclohexyl), 1,8-diisocyanato-p-menthane, 1,3-diisocyanatoadamantane and 1,3-dimethyl-5,7-diisocyanatoadamantane and oligomers derived therefrom.

Araliphatic Polyisocyanates

In an araliphatic polyisocyanate all isocyanate groups are bonded to methylene radicals which are in turn bonded to an aromatic ring.

Araliphatic polyiolyisocyanates that are particularly suitable according to the invention are 1,3- and 1,4-bis(isocyanatomethyl)benzene (xyxlylene diisocyanate; XDI), 1,3- and 1,4-bis(1-isocyanato-1-methylethyl)benzene (TMXDI) and bis(4-(1-isocyanato-1-methylethyl)phenyl) carbonate and oligomers derived therefrom.

Aromatic Polyisocyanates

In an aromatic polyisocyanate all isocyanate groups are bonded directly to carbon atoms which are part of an aromatic ring.

Aromatic polyisocyanates that are particularly suitable according to the invention are 2,4- and 2,6-diisocyanatotoluene (TDI), 2,4'- and 4,4'-diisocyanatodiphenylmethane (MDI) and 1,5-diisocyanatonaphthalene and oligomers derived therefrom.

Catalyst

A "trimerization catalyst" as understood in the present application is catalyst which catalyzes the addition of isocyanate groups to isocyanurate structures. It is preferred that said catalyst converts not more than 20 mol-%, more preferably not more than 10 mol-% and most preferably not more than 5 mol-% of the isocyanate groups in the polymerizable composition to uretdione groups as these groups are less stable and compromise the chemical and physical properties of the material. Moreover, the concentration of uretdione-forming catalysts in the composition is preferably not more than 10 wt.-%, more preferably not more than 3 wt.-% of the total mass of uretdione-forming catalysts and trimerization catalysts present in the polymerizable composition. Most preferably, the composition is free of uretdione-forming catalysts.

Suitable trimerization catalysts are, for example, simple tertiary amines, for example triethylamine, tributylamine, N,N-dimethylaniline, N-ethylpiperidine or N,N'-dimethylpiperazine. Suitable catalysts also include the tertiary hydroxyalkylamines described in GB 2 221 465, for example triethanolamine, N-methyldiethanolamine, dimethylethanolamine, N-isopropyldiethanolamine and 1-(2-hydroxyethyl)pyrrolidine or the catalyst systems known from GB 2 222 161 that consist of mixtures of tertiary bicyclic amines, for example DBU, with simple aliphatic alcohols of low molecular weight.

Further trimerization catalysts are, for example, the quaternary ammonium hydroxides known from DE-A 1 667 309, EP-A 0 013 880 and EP-A 0 047 452, for example tetraethylammonium hydroxide, trimethylbenzylammonium hydroxide, N,N-dimethyl-N-dodecyl-N-(2-hydroxide, N-(2-hydroxyethyl)-N,N-dimethyl-N-(2,2'-hydroxyethyl)ammonium dihydroxymethylbutyl)ammonium hydroxide and 1-(2-hydroxyethyl)-1,4-diazabicyclo[2.2.2]octane hydroxide (monoadduct of ethylene oxide and water onto 1,4-diazabicyclo[2.2.2]octane), the quaternary hydroxyalkylammonium hydroxides known from EP-A 37 65 or EP-A 10 589, for example N,N,N-trimethyl-N-(2-hydroxyethyl)ammonium hydroxide, the trialkylhydroxylalkylammonium carboxylates that are known from DE-A 2631733, EP-A 0 671 426, EP-A 1 599 526 and U.S. Pat. No. 4,789,705, for example N,N,N-trimethyl-N-2-hydroxypropylammonium p-tert-butylbenzoate and N,N,N-trimethyl-N-2-hydroxypropylammonium 2-ethylhexanoate, the quaternary benzylammonium carboxylates known from EP-A 1 229 016, for example N-benzyl-N, N-dimethyl-N-ethylammonium pivalate, N-benzyl-N,N-dimethyl-N-ethylammonium 2-ethylhexanoate, N-benzyl-N,N,N-tributylammonium 2-ethylhexanoate, N,N-dimethyl-N-ethyl-N-(4-methoxybenzyl) ammonium 2-ethylhexanoate or N,N, N-tributyl-N-(4-methoxybenzyl)ammonium pivalate, the tetrasubstituted ammonium α-hydroxycarboxylates known from WO 2005/087828, for example tetramethylammonium lactate, the quaternary ammonium or phosphonium fluorides known from EP-A 0 339 396, EP-A 0 379 914 and EP-A 0 443 167, for example N-methyl-N,N, N-trialkylammonium fluorides with C8-C10-alkyl radicals, N,N, N, N-tetra-n-butylammonium fluoride, N,N,N-trimethyl-N-benzylammonium fluoride, tetramethylphosphonium fluoride, tetraethylphosphonium fluoride or tetra-n-butylphosphonium fluoride, the quaternary ammonium and phosphonium polyfluorides known from EP-A 0 798 299, EP-A 0 896 009 and EP-A 0 962 455, for example benzyltrimethylammonium hydrogen polyfluoride, the tetraalkylammonium alkylcarbonates which are known from EP-A 0 668 271 and are obtainable by reaction of tertiary amines with dialkyl carbonates, or betaine-structured quaternary ammonioalkyl carbonates, the quaternary ammonium hydrogencarbonates known from WO 1999/023128, for example choline bicarbonate, the quaternary ammonium salts which are known from EP 0 102 482 and are obtainable from tertiary amines and alkylating esters of phosphorus acids, examples of such salts being reaction products of triethylamine, DABCO or N-methylmorpholine with dimethyl methanephosphonate, or the tetrasubstituted ammonium salts of lactams that are known from WO 2013/167404, for example trioctylammonium caprolactamate or dodecyltrimethylammonium caprolactamate.

Suitable salts are the known sodium and potassium salts of linear or branched alkanecarboxylic acids having up to 14 carbon atoms, for example butyric acid, valeric acid, caproic acid, 2-ethylhexanoic acid, heptanoic acid, caprylic acid, pelargonic acid and higher homologs.

Likewise suitable as trimerization catalysts are a multitude of different metal compounds. Suitable examples are the octoates and naphthenates of manganese, iron, cobalt, nickel, copper, zinc, zirconium, cerium or lead or mixtures thereof with acetates of lithium, sodium, potassium, calcium or barium that are described as catalysts in DE-A 3 240 613, the sodium and potassium salts of linear or branched alkanecarboxylic acids having up to 10 carbon atoms that are disclosed by DE-A 3 219 608, such as of propionic acid, butyric acid, valeric acid, caproic acid, heptanoic acid, caprylic acid, pelargonic acid, capric acid and undecylic acid, the alkali metal or alkaline earth metal salts of aliphatic, cycloaliphatic or aromatic mono- and polycarboxylic acids having 2 to 20 carbon atoms that are disclosed by EP-A 0 100 129, such as sodium benzoate or potassium benzoate, the alkali metal phenoxides disclosed by GB-A 1 391 066 and GB-A 1 386 399, such as sodium phenoxide or potassium phenoxide, the alkali metal and alkaline earth metal oxides, hydroxides, carbonates, alkoxides and phenoxides disclosed by GB 809 809, alkali metal salts of enolizable compounds and metal salts of weak aliphatic or cycloaliphatic carboxylic acids such as sodium methoxide, sodium acetate, potassium acetate, sodium acetoacetate, lead 2-ethylhexanoate, and lead naphthenate, the basic alkali metal compounds complexed with crown ethers or polyether alcohols that are disclosed by EP-A 0 056 158 and EP-A 0 056 159, such as complexed sodium carboxylates or potassium carboxylates and/or the pyrrolidinone potassium salt disclosed by EP-A 0 033 581, the mono- or polynuclear complex of titanium, zirconium and/or hafnium disclosed by application EP 13196508.9, such as zirconium tetra-n-butoxide, zirconium tetra-2-ethylhexanoate and zirconium tetra-2-ethylhexoxide, and tin compounds of the type described in European Polymer Journal, vol. 16, 147-148 (1979), such as dibutyltin dichloride, diphenyltin dichloride, triphenylstannanol, tributyltin acetate, tin octoate, dibutyl (dimethoxy)stannane, and tributyltin imidazolate.

Further trimerization catalysts suitable for the process of the invention can be found, for example, in J. H. Saunders and K. C. Frisch, Polyurethanes Chemistry and Technology, p. 94 ff. (1962) and the literature cited therein.

The trimerization catalysts can be used in the process according to the invention either individually or in the form of any desired mixtures with one another.

Likewise particularly suitable are alkali metal or alkaline earth metal salts of aliphatic, cycloaliphatic or aromatic mono- and polycarboxylic acids having 2 to 20 carbon atoms. The potassium salt of any of the abovementioned carboxylic acids is yet more preferred. Potassium acetate is particularly preferred.

However, all catalysts recited in WO 2016/170057, WO 2016/170059 or WO 2016/170061 are also suitable in principle provided they catalyze the crosslinking reaction in the abovementioned temperature ranges.

Particularly suitable as trimerization catalyst are catalysts of formula (I) and their adducts.

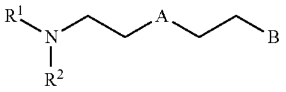
(I)

wherein $R^1$ and $R^2$ are independently of one another selected from the group consisting of hydrogen, methyl, ethyl, propyl, isopropyl, butyl, isobutyl, branched C5-alkyl, unbranched C5-alkyl, branched C6-alkyl, unbranched C6-alkyl, branched C7-alkyl and unbranched C7-alkyl;

A is selected from the group consisting of O, S and $NR^3$, wherein $R^3$ is selected from the group consisting of hydrogen, methyl, ethyl, propyl, isopropyl, butyl and isobutyl; and B is independently of A selected from the group consisting of OH, SH $NHR^4$ and $NH_2$, wherein $R^4$ is selected from the group consisting of methyl, ethyl and propyl.

In a preferred embodiment, A is $NR^3$, wherein $R^3$ is selected from the group consisting of hydrogen, methyl, ethyl, propyl, isopropyl, butyl and isobutyl. $R^3$ is preferably methyl or ethyl. $R^3$ is particularly preferably methyl.

In a first variant of this embodiment, B is OH and $R^1$ and $R^2$ are independently of one another selected from the group consisting of hydrogen, methyl, ethyl, propyl, isopropyl, butyl, isobutyl, branched C5-alkyl, unbranched C5-alkyl, branched C6-alkyl, unbranched C6-alkyl, branched C7-alkyl and unbranched C7-alkyl. It is preferable when $R^1$ and $R^2$ are independently of one another methyl or ethyl. $R^1$ and $R^2$ are particularly preferably methyl.

In a second variant of this embodiment, B is SH and $R^1$ and $R^2$ are independently of one another selected from the group consisting of hydrogen, methyl, ethyl, propyl, isopropyl, butyl, isobutyl, branched C5-alkyl, unbranched C5-alkyl, branched C6-alkyl, unbranched C6-alkyl, branched C7-alkyl and unbranched C7-alkyl. It is preferable when $R^1$ and $R^2$ are independently of one another methyl or ethyl. $R^1$ and $R^2$ are particularly preferably methyl.

In a third variant of this embodiment, B is $NHR^4$ and $R^1$ and $R^2$ are independently of one another selected from the group consisting of hydrogen, methyl, ethyl, propyl, isopropyl, butyl, isobutyl, branched C5-alkyl, unbranched C5-alkyl, branched C6-alkyl, unbranched C6-alkyl, branched C7-alkyl and unbranched C7-alkyl. It is preferable when $R^1$ and $R^2$ are independently of one another methyl or ethyl. $R^1$ and $R^2$ are particularly preferably methyl. In this variant, $R^4$ is selected from the group consisting of methyl, ethyl and propyl. It is preferable when $R^4$ is methyl or ethyl. $R^4$ is particularly preferably methyl.

In a fourth variant of this embodiment, B is $NH_2$ and $R^1$ and $R^2$ are independently of one another selected from the group consisting of hydrogen, methyl, ethyl, propyl, isopropyl, butyl, isobutyl, branched C5-alkyl, unbranched C5-alkyl, branched C6-alkyl, unbranched C6-alkyl, branched C7-alkyl and unbranched C7-alkyl. It is preferable when $R^1$ and $R^2$ are independently of one another methyl or ethyl. $R^1$ and $R^2$ are particularly preferably methyl.

In a further preferred embodiment, A is oxygen.

In a first variant of this embodiment, B is OH and $R^1$ and $R^2$ are independently of one another selected from the group consisting of hydrogen, methyl, ethyl, propyl, isopropyl, butyl, isobutyl, branched C5-alkyl, unbranched C5-alkyl, branched C6-alkyl, unbranched C6-alkyl, branched C7-alkyl and unbranched C7-alkyl. It is preferable when $R^1$ and $R^2$ are independently of one another methyl or ethyl. $R^1$ and $R^2$ are particularly preferably methyl.

In a second variant of this embodiment, B is SH and $R^1$ and $R^2$ are independently of one another selected from the group consisting of hydrogen, methyl, ethyl, propyl, isopropyl, butyl, isobutyl, branched C5-alkyl, unbranched C5-alkyl, branched C6-alkyl, unbranched C6-alkyl, branched C7-alkyl and unbranched C7-alkyl. It is preferable when $R^1$ and $R^2$ are independently of one another methyl or ethyl. $R^1$ and $R^2$ are particularly preferably methyl.

In a third variant of this embodiment, B is $NHR^4$ and $R^1$ and $R^2$ are independently of one another selected from the group consisting of hydrogen, methyl, ethyl, propyl, isopropyl, butyl, isobutyl, branched C5-alkyl, unbranched C5-alkyl, branched C6-alkyl, unbranched C6-alkyl, branched C7-alkyl and unbranched C7-alkyl. It is preferable when $R^1$ and $R^2$ are independently of one another methyl or ethyl. $R^1$ and $R^2$ are particularly preferably methyl. In this variant, $R^4$ is selected from the group consisting of methyl, ethyl and propyl. It is preferable when $R^4$ is methyl or ethyl. $R^4$ is particularly preferably methyl.

In a fourth variant of this embodiment, B is $NH_2$ and $R^1$ and $R^2$ are independently of one another selected from the group consisting of hydrogen, methyl, ethyl, propyl, isopropyl, butyl, isobutyl, branched C5-alkyl, unbranched C5-alkyl, branched C6-alkyl, unbranched C6-alkyl, branched C7-alkyl and unbranched C7-alkyl. It is preferable when $R^1$ and $R^2$ are independently of one another methyl or ethyl. $R^1$ and $R^2$ are particularly preferably methyl.

In yet a further preferred embodiment, A is sulfur.

In a first variant of this embodiment, B is OH and $R^1$ and $R^2$ are independently of one another selected from the group consisting of hydrogen, methyl, ethyl, propyl, isopropyl, butyl, isobutyl, branched C5-alkyl, unbranched C5-alkyl, branched C6-alkyl, unbranched C6-alkyl, branched C7-alkyl and unbranched C7-alkyl. It is preferable when $R^1$ and $R^2$ are independently of one another methyl or ethyl. $R^1$ and $R^2$ are particularly preferably methyl.

In a second variant of this embodiment, B is SH and $R^1$ and $R^2$ are independently of one another selected from the group consisting of hydrogen, methyl, ethyl, propyl, isopropyl, butyl, isobutyl, branched C5-alkyl, unbranched C5-alkyl, branched C6-alkyl, unbranched C6-alkyl, branched C7-alkyl and unbranched C7-alkyl. It is preferable when $R^1$ and $R^2$ are independently of one another methyl or ethyl. $R^1$ and $R^2$ are particularly preferably methyl.

In a third variant of this embodiment, B is $NHR^4$ and $R^1$ and $R^2$ are independently of one another selected from the group consisting of hydrogen, methyl, ethyl, propyl, isopropyl, butyl, isobutyl, branched C5-alkyl, unbranched C5-alkyl, branched C6-alkyl, unbranched C6-alkyl, branched C7-alkyl and unbranched C7-alkyl. It is preferable when $R^1$ and $R^2$ are independently of one another methyl or ethyl. $R^1$ and $R^2$ are particularly preferably methyl. In this variant, $R^4$ is selected from the group consisting of methyl, ethyl and propyl. It is preferable when $R^4$ is methyl or ethyl. $R^4$ is particularly preferably methyl.

In a fourth variant of this embodiment, B is $NH_2$ and $R^1$ and $R^2$ are independently of one another selected from the group consisting of hydrogen, methyl, ethyl, propyl, isopropyl, butyl, isobutyl, branched C5-alkyl, unbranched C5-alkyl, branched C6-alkyl, unbranched C6-alkyl, branched C7-alkyl and unbranched C7-alkyl. It is preferable when $R^1$ and $R^2$ are independently of one another methyl or ethyl. $R^1$ and $R^2$ are particularly preferably methyl.

Also suitable are adducts of a compound of formula (I) and a compound having at least one isocyanate group.

The umbrella term "adduct" is understood to mean urethane, thiourethane and urea adducts of a compound of formula (I) with a compound having at least one isocyanate group. A urethane adduct is particularly preferred. The adducts of the invention are formed when an isocyanate reacts with the functional group B of the compound defined in formula (I). When B is a hydroxyl group a urethane adduct is formed. When B is a thiol group a thiourethane adduct is formed. And when B is $NH_2$ or $NHR^4$ a urea adduct is formed.

Suitable catalyst solvents are, for example, solvents that are inert toward isocyanate groups, for example hexane, toluene, xylene, chlorobenzene, ethyl acetate, butyl acetate, diethylene glycol dimethyl ether, dipropylene glycol dimethyl ether, ethylene glycol monomethyl or monoethyl ether acetate, diethylene glycol ethyl and butyl ether acetate, propylene glycol monomethyl ether acetate, 1-methoxy-2-propyl acetate, 3-methoxy-n-butyl acetate, propylene glycol diacetate, acetone, methyl ethyl ketone, methyl isobutyl ketone, cyclohexanone, lactones, such as β-propiolactone, γ-butyrolactone, ε-caprolactone and ε-methylcaprolactone, but also solvents such as N-methylpyrrolidone and N-methylcaprolactam, 1,2-propylene carbonate, methylene chloride, dimethyl sulfoxide, triethyl phosphate or any desired mixtures of such solvents.

If catalyst solvents are used in the polymerizable composition, preference is given to using catalyst solvents which bear groups reactive toward isocyanates and can be incorporated into the polyisocyanurate resin. Examples of such solvents are mono- or polyhydric simple alcohols, for example methanol, ethanol, n-propanol, isopropanol, n-butanol, n-hexanol, 2-ethyl-1-hexanol, ethylene glycol, propylene glycol, the isomeric butanediols, 2-ethylhexane-1,3-diol or glycerol; ether alcohols, for example 1-methoxy-2-propanol, 3-ethyl-3-hydroxymethyloxetane, tetrahydrofurfuryl alcohol, ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, diethylene glycol, dipropylene glycol or else liquid higher molecular weight polyethylene glycols, polypropylene glycols, mixed polyethylene/polypropylene glycols and the monoalkyl ethers thereof; ester alcohols, for example ethylene glycol monoacetate, propylene glycol monolaurate, glycerol mono- and diacetate, glycerol monobutyrate or 2,2,4-trimethylpentane-1,3-diol monoisobutyrate; unsaturated alcohols, for example allyl alcohol, 1,1-dimethylallyl alcohol or oleyl alcohol; araliphatic alcohols, for example benzyl alcohol; N-monosubstituted amides, for example N-methylformamide, N-methylacetamide, cyanoacetamide or 2-pyrrolidinone, or any desired mixtures of such solvents.

Solvent

Suitable solvents must be inert toward isocyanate groups, i.e. they must not contain isocyanate-reactive groups as defined above in this application. The solvent is preferably selected from the group consisting of hexane, toluene, xylene, chlorobenzene, ethyl acetate, butyl acetate, diethylene glycol dimethyl ether, dipropylene glycol dimethyl ether, ethylene glycol monomethyl or monoethyl ether acetate, diethylene glycol ethyl and butyl ether acetate, propylene glycol monomethyl ether acetate, 1-methoxyprop-2-yl acetate, 3-methoxy-n-butyl acetate, propylene glycol diacetate, acetone, methyl ethyl ketone, methyl isobutyl ketone, cyclohexanone, lactones such as β-propiolactone, γ-butyrolactone, ε-caprolactone and ε-methylcaprolactone, N-methylpyrrolidone, N-methylcaprolactam, 1,2-propylene carbonate, methylene chloride, dimethylformamide, trichloro ethylene, dimethyl sulfoxide and triethyl phosphate. More preferably, the at least one solvent is selected from the group consisting of butyl acetate.

Filler

Any type of inorganic or inorganic filler known in the art may be used. Preferred inorganic fillers are selected from the group consisting of metal oxides, nitrites, silicides, particularly silica, borides, particularly boron nitride, wollastonite, talc, kaolin, clay, mica, alumina, zirconia, titania and mixtures thereof. Preferred organic fillers are selected from the group consisting of fluorine-based polymers, polystyrene-based polymers, divinylbenzene-based polymers, polyimide-based polymers, polyphenyl ether-based polymers, poly (triallyly isocyanurate)-based polymers and mixtures thereof. The organic and inorganic fibers described further below in this application are not fillers as understood in this paragraph.

Additives

Moreover, the polymerizable composition of the present invention may comprise at least one additive selected from the group consisting of antioxidants, flame retardants, heat stabilizers, antistatic agents, UV-absorbers, pigments, wetting agents, defoaming agents, colorants, lubricants, adhesion promoters, additional monomers and compatibilizers. Preferred additional monomers are selected from the group consisting of styrene, vinyl toluene, t-butyl styrene, para-methyl styrene, diallyl phthalate, 2, 4-ethylmethyl imidazole, polyphenyl ether, triallyl isocyanurate, butadiene, isoprene and 1,2-butadiene. Preferred compatibilizers are selected from the group consisting of styrene-butadiene block copolymers, styrene-isoprene block copolymers, 1,2-polybutadiene, 1,4-polybutadiene, maleic acid-modified polybutadiene, acrylic acid-modified polybutadiene, epoxy-modified polybutadiene and mixtures thereof.

Method for Manufacturing a Semi-Finished Product

In another embodiment, the present invention relates to a method comprising the steps of a) providing a polymerizable composition as defined above in this application; and
b) curing the polymerizable composition at a temperature between 150 °C and 200 °C, whereby a semi-finished product is obtained.

The term "providing a polymerizable composition" refers to a process which results in a polymerizable composition as set forth above. Suitable methods are known in the art.

The curing in method step results in a "semi-finished product", i.e. in a material which can be processed further or transported but is still soft and flexible enough to be processed, e.g. by pressing it into a mold.

In one preferred embodiment method step b) is continued until the resulting polymer is tack-free.

In another preferred embodiment, method step b) is continued until 2% to 60% of the free isocyanate groups present at the beginning of method step b) are consumed.

In yet another preferred embodiment method step b) is continued until the polymerizable composition reaches a viscosity of 30,000 to 750,000 mPas, preferably 50,000 to 750,000 mPas and most preferably 100,000 to 750,000 mPas. The viscosity is preferably determined using a cone and plate viscosimeter at a temperature of 23 °C and a shear rate of 1/s.

In a particularly preferred embodiment method step b) is continued until module G' determined by a plate-plate rheometer according to ISO 6721-10:2015-09 at a temperature of 23 °C and a shear rate of 1/s reaches $5\times10^3$ Pa.

If an inert organic solvent is present in the polymerizable composition, method step b) is preferably continued until at least 90 wt.-% of the organic solvent are evaporated. This criterium is preferably combined with one or more of the above-defined criteria which relate to the state of polymer network.

In any case it is preferred that at the end of method step b) at least 20%, preferably at least 30% of the free isocyanate groups present at the beginning of method step b) are still present so that a second curing step is possible.

Method step b) is preferably performed at a temperature between 150 °C and 200 °C for 1 to 20 minutes. The combination of temperature and duration for the first curing step depend on the geometry of the product and the types of polyisocyanate and catalyst(s) present in the polymerizable composition to be used. It can easily be determined by simple preliminary experiments applying one of the preferred end points of method step b) set forth above.

Method step b) can easily be stopped by decreasing the temperature to a temperature of not more than 60 °C, preferably not more than 40 °C.

In a preferred embodiment of the present invention the polymerizable composition a fiber or a metal sheet is coated with the polymerizable composition provided in method step a) before commencing method step b). The fiber may be any inorganic or organic fiber used in the art for making composite materials. The fiber may have a size. The metal sheet is preferably a copper sheet.

Preferred inorganic fibers are glass fibers, basalt fibers, boron fibers, ceramic fibers, whiskers, silica fibers and metallic reinforcing fibers. Preferred organic fibers are natural fibers, aramid fibers, carbon fibers, carbon nanotubes, polyester fibers, nylon fibers and Plexiglass fibers. Preferred natural fibers are flax fibers, hemp fibers, wood fibers, cellulose fibers and sisal fibers.

If one or more fibers or one or more metal sheets are coated with the polymerizable composition before commencing method step b), the semi-finished product resulting from method step b) is a so-called “prepreg”. This term refers to a fiber or a plurality of fibers or a metal sheet pre-coated with a polymerizable composition which has been partially cured so that said fiber or fibers or metal sheet can be transported or processed.

The method of the present invention results in particularly advantageous semi-finished products because crosslinking of isocyanate groups by trimerization only proceeds at temperatures far above room temperature so that the semi-finished can be stored for several weeks at room temperature without losing its ability to be processed further.

In yet another embodiment, the present invention relates to a semi-finished product obtained or obtainable by the method of the present invention.

Method steps a) and b) result in a semi-finished product which may be sold, transported and processed further by the customer. In a preferred embodiment, said semi-finished product is a prepreg.

Method for Manufacturing a Fully Cured Product

In another preferred embodiment, the method of the present invention comprises an additional method step c) of curing the semi-finished product, whereby a finished product is obtained.

Method step c) preferably proceeds until at least 90% of the isocyanate groups originally present in the polymerizable composition at the beginning of method step b) are consumed.

For method step c) a temperature between 200 °C and 250 °C is preferred. The preferred duration of method step c) is 1 hour to 8 hours, more preferably 2 hours to 6 hours.

It is preferred that method step c) is commenced 1 day to 30 days, more preferably 3 days to 14 days, after method step b) is finished. Moreover, it is preferred that the location at which method step c) is performed is at least 1 km, more preferably at least 10 km away from the location at which method step b) is performed, i.e. that the semi-finished product is transported to a different location before the second curing step.

Method step c) results in a fully cured product.

In yet another embodiment, the present invention relates to a finished product obtained or obtainable by the method of the present invention comprising method steps a), b) and c) as defined above.

Preferably, the finished product forms part of a laminate, metal-clad laminate or printed circuit board, more preferably of a copper-clad laminate or printed circuit board.

The finished product is a polyisocyanurate plastic, i.e. it is a polymer whose crosslinking groups are predominantly isocyanurate groups. Compared with other polymers this product is characterized by superior hardness and heat resistance. Moreover, even without the addition of dedicated flame retardants it is intrinsically flame-proof.

The following examples are merely intended to illustrate the invention. They shall not limit the scope of the claims in any way.

Examples

The currently prevailing ambient temperature of 25 °C is described as RT in this experimental section.

Determination of the NCO Content by FT-IR:

IR spectra were recorded on a Spectrum of FT-IR spectrometer from Perkin Elmer, Inc. equipped with an ATR unit. Residual NCO content was monitored by recording the change of isocyanate groups (band at 2270 $cm^{-1}$).

Determination of the Tg Value of Cured Resin by DSC:

The glass transition temperature (Tg) of the prepregs after post curing was determined by differential scanning calorimetry (DSC) on a TA DSC Q20 according to IPC-TM-650 2.4.25.

Determination of Tg Value of CCL by DMA:

The glass transition temperature Tg of the base laminate material without the cladding was determined using dynamic mechanical analysis according to IPC-TM-650 2.4.24.4.

Determination of Td Value of CCL by DMA:

The thermal decomposition temperature $T_d$ of base laminate material without the cladding was determined using thermogravimetric analysis according to IPC-TM-650 2.4.24.6 to record the temperature $T_d$ (5%) at which the mass of the sample is 5.0% less than its mass measured at 50 °C.

Determination of Dk and Df Values of CCL by SPDR:

The dielectric constant (Dk) and dissipation factor (Df) of base laminate material without the cladding was determined using split post dielectric resonator (SPDR) at 10G microwave frequency according to IEC 61189-2-721.

Raw Materials:

Desmodur N 3600 is a hexamethylene diisocyanate (HDI) trimer (NCO functionality >3) with 23.0 wt.-% NCO content, the viscosity is about 1200 mPas at 23 °C. (DIN EN ISO 3219/A.3), from Covestro AG.

Desmodur N 3900 is a HDI trimer (NCO functionality >3) with 23.5 wt.-% NCO content, the viscosity is about 730 mPas at 23 °C. (DIN EN ISO 3219/A.3), from Covestro AG.

Desmodur eco N 7300 is a biobased pentamethylene diisocyanate (PDI) trimer (NCO functionality >3) with 21.9 wt.-% NCO content, the viscosity is about 9500 mPas at 23 °C. (DIN EN ISO 3219/A.3), from Covestro AG.

Desmodur Z4470 is an isophorone diisocyanate (IPDI) trimer (NCO functionality >3) in butyl acetate (BA) or solvent naphtha (SN) with 70 wt.-% solid content, 11.9 wt.-% NCO content, the viscosity is about 1500 mPas at 23 °C. (DIN EN ISO 3219/A.3), from Covestro AG.

Desmodur IL is a toluene diisocyanate (TDI) trimer (NCO functionality >3) in butyl acetate (BA) or ethyl acetate (EA) with 51 wt.-% solid content, 8.0 wt.-% NCO content, the viscosity is 700-2000 mPas at 23 °C. (DIN EN ISO 3219/A.3), from Covestro AG.

Desmodur XP 2489 is a HDI isophorone diisocyanate (IPDI) polyisocyanate (NCO functionality >3) with 21.0 wt.-% NCO content, the viscosity is about 22,500 mPas at 23 °C. (DIN EN ISO 3219/A.3), from Covestro AG.

Catalyst: 2-[2-(dimethylamino)ethyl-methylamino] ethanol is purchase from TCI Co. Ltd.

Solvent: Butyl acetate is purchased with the purity ≥99.0% from Sinopharm Chemical Reagent Co., Ltd.

Silica powder is purchased from Denka Co., jp.

Type 2116 E-glass fiber woven cloth is purchased from CTM glass fiber Co., Ltd.

General Method of Preparing the Resin Compositions and Prepregs

1. The ingredient listed in Table 1 and Table 2 are added to a mixing vessel;
2. The ingredients are mixed at 2500 rpm for at 60-300 seconds using SpeedMixer DAC 400 FV at room temperature. At this point, the composition is ready for use.
3. A 2116 woven glass cloth was impregnated into the well-mixed compositions and controlled to have an appropriate thickness
3. The impregnated glass cloth was baked in an oven at 180-200 °C for 2-15 minutes for removing the solvent and partly curing the resin composition to prepare a prepreg.

The residual NCO content was monitored by FT-IR.

The storage-stability was checked by monitoring the residual NCO content after several days using FT-IR.

4. The prepreg was then pressed at 200-220 °C, and preferably to give some pressure e.g. 5 bars to give a fiber-composite component.

The residual NCO content after post curing was monitored by FT-IR

The Tg and Td of the cured resin in composited was monitored by DSC and TGA.

Application Example

For making CCL, the resin composition from Example 1, Example 2 and Comparative Example 2 are respectively mixed with 30 wt.-% of silica powder in a certain proportion in butyl acetate, and the solid content of the glue solution was controlled to be 65%. A 2116 glass cloth was impregnated into the above-mentioned glue solution and controlled to have an appropriate thickness, and then based in an oven at 180-200 °C for 2-15 min to prepreg a prepreg. Then 6 sheets of prepreg were stacked together with both sides stacked with copper foils and were cured at a curing temperature of 170-250 °C, and a curing pressure of 25-50 bar for 200-300 min to obtain a copper clad laminate.

The Tg of CCL was monitored by DMA

The Td of CCL was monitored by TGA

The DK, Df of CCL was monitored by SPDR

The performance of the CCL was shown in Table 3.

TABLE 1

| Formulation | Example 1 | Example 2 | Example 3 | Example 4 | Example 5 | Example 6 | Example 7 |
|---|---|---|---|---|---|---|---|
| Desmodur N 3600 | 25 g | 35 g | 15 g | | 15 g | | |
| Desmodur N 3900 | | | | | | | 25 g |
| Desmodur Eco N7300 | | | | 15 g | | | |
| Desmodur Z4470 | 35.7 g | 21.4 g | 50 g | 50 g | 35.7 g | | 35.7 g |
| Desmodur IL | | | | | 20 g | | |
| Desmodur XP2489 | | | | | | 50 g | |
| Catalyst | 0.39 g | 0.39 g | 0.39 g | 0.39 g | 0.39 g | 0.39 g | 0.39 g |
| Solvent | 4.3 g | 8.6 g | | | | 15 | 4.3 g |
| Solid content (wt.-%) | 77% | 77% | 77% | 77% | 77% | 77% | 77% |
| Residual NCO content % in prepreg | 94% | 98% | 94% | 93% | 47% | 98% | 89% |
| Residual NCO content % in prepreg after 10 days | 55% | 45% | 80% | 74% | 40% | 80% | 54% |
| Residual NCO content % in composite after curing | 5% | 8% | 12% | 0.2% | 9% | 8% | 5% |

TABLE 1-continued

| Formulation | Example 1 | Example 2 | Example 3 | Example 4 | Example 5 | Example 6 | Example 7 |
|---|---|---|---|---|---|---|---|
| Tg of cured resin in composite by DSC (°C) | >180 | 175 | >200 | >200 | >200 | 175 | 144 |
| Td of cured resin in composite by TGA (°C) | 345 | 320 | 340 | 340 | 331 | 353 | 295 |

TABLE 2

| Formulation | Comparative Example 1 | Comparative Example 2 | Comparative Example 3 | Comparative Example 4 |
|---|---|---|---|---|
| Desmodur N 3600 | 45 g | 20 g | | |
| Desmodur N 3900 | | | | |
| Desmodur Z4470 | 7.1 g | | | 14.3 g |
| Desmodur Eco N7300 | | | | 40 g |
| Desmodur IL | | | 98 g | |
| Catalyst | 0.39 g | 0.15 g | 0.39 g | 0.39 g |
| Solvent | 12.9 g | 6 g | | 10.7 g |
| Solid content (wt %) | 77% | 77% | 51% | 77% |
| Residucal NCO content % in prepreg | 96% | 6% | 81% | 94% |
| Residucal NCO content % in prepreg after 10 days | 25% | 2% | 18% | 38% |
| Residucal NCO content % in composite after curing | 2% | 2% | 16% | 3% |
| Tg of cured resin in composite by DSC (°C) | 128 | 111 | >200 | 140 |
| Td of cured resin in composite by TGA (°C) | 340 | 315 | 360 | 334 |

TABLE 3

| | Application Example 1 | Application Example2 | Comparative Application Example 1 |
|---|---|---|---|
| Based on: | Example 1 | Example 2 | Comparative Example 2 |
| Dk by SPDR at 10 GHZ | 3.87 | 3.77 | The prepregs can't be pressed together, not applicable for further testing |
| Df by SPDR at 10 GHZ | 0.0067 | 0.0067 | |
| Tg by DMA (°C) | 229 | 199 | |
| Td by TGA (°C) | 344 | 345 | |

Examples 1 to 7 show that the present resin compositions provide a feasible prepreg solutions with good storage stability. If high heat resistance is demanded as an additional property, examples 1 to 6 as compared to example 7 show that polyisocyanates having isocyanurate structures (examples 1 to 6) should rather be used than asymmetric trimers (example 7).

Comparative Example 1 (10% IPDI trimer+90% HDI trimer) and Comparative Example 4 (20% IPDI trimer+80% PDI trimer) show that a low content of IPDI trimer also leads to low Tg.

Comparative Example 2 shows (i) that the Tg for the system is too low to meet CCL application requirement and (ii) that a system with only aliphatic polyisocyanates is almost fully cured already after the first curing step, during the second curing step, only slight NCO groups were further consumed, which will result in bad adhesion or interlay strength for making composites, This problem was shown as in Comparative application example 1.

Comparative Example 3 shows that pure aromatic trimer will make the system moisture sensitive and will quickly become a high viscosity system which can't be easily used to impregnate the fiber. During the storage, the free isocyanate will be easily consumed, so that not enough residual NCO-content is left for the second curing step further pressing. Thus, this system is not practical for industrial application.

The invention claimed is:

1. A polymerizable composition which is free from isocyanate-reactive groups or has a molar ratio of isocyanate groups of the isocyanate component to isocyanate-reactive groups of at least 2.0:1.0 comprising a) at least one aliphatic polyisocyanate;

b) at least one cycloaliphatic oligomeric polyisocyanate; and c) at least one trimerization catalyst;

wherein the concentration of cycloaliphatic oligomeric polyisocyanates is 25 wt.-% to 75 wt.-% based on the total mass of all polyisocyanates present in the polymerizable composition; and wherein, the concentration of uretdione-forming catalysts in the composition is not more than 10 wt.-% of the total mass of uretdione-forming catalysts and trimerization catalysts present in the polymerizable composition.

2. The polymerizable composition according to claim 1, additionally comprising 10 wt.-% to 50 wt.-% of at least one inert solvent based on the sum of all polyisocyanates, all trimerization catalysts and all solvents.

3. The polymerizable composition according to claim 1, wherein the at least one aliphatic polyisocyanate makes up 10 wt.-% to 65 wt.-% of the total amount of all polyisocyanates present in the polymerizable composition.

4. The polymerizable composition according to claim 1, wherein the at least one oligomeric cycloaliphatic polyisocyanate contains at least 50 mol-% isocyanurate structures based on the sum total of oligomeric structures from the group consisting of uretdione, isocyanurate, allophanate, biuret, iminooxadiazinedione and oxadiazinetrione structure present in the oligomeric cycloaliphatic polyisocyanate.

5. The polymerizable composition of claim 1, wherein a trimerization catalyst according to formula (I) or an adduct thereof is used

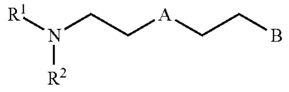

(I)

wherein $R^1$ and $R^2$ are independently of one another selected from the group consisting of hydrogen, methyl, ethyl, propyl, isopropyl, butyl, isobutyl, branched C5-alkyl, unbranched C5-alkyl, branched C6-alkyl, unbranched C6-alkyl, branched C7-alkyl and unbranched C7-alkyl;

A is selected from the group consisting of O, S and $NR^3$, wherein $R^3$ is selected from the group consisting of hydrogen, methyl, ethyl, propyl, isopropyl, butyl and isobutyl; and B is independently of A selected from the group consisting of OH, SH, $NHR^4$ and $NH_2$, wherein $R^4$ is selected from the group consisting of methyl, ethyl and propyl.

6. The polymerizable composition according claim 1, additionally comprising an organic or inorganic filler.

7. A method comprising the steps of a) providing a polymerizable composition as defined in claim 1; and b) curing the polymerizable composition at a temperature between 150 °C and 200 °C, whereby a semi-finished product is obtained.

8. The method according to claim 7, wherein method step b) is continued until the polymerizable composition reaches a viscosity of 30,000 to 750,000 mPas, determined at a temperature of 23 °C using a cone and plate viscometer at a shear rate of 1/s.

9. The method according to claim 7, wherein method step b) is continued until 2% to 60% of the free isocyanate groups present at the beginning of method step b) are consumed.

10. The method according to claim 7, additionally comprising a method step a1) of coating at least one organic or inorganic fiber with the polymerizable composition provided in method step a).

11. The method according to claim 7, additionally comprising a method step c) of curing the semi-finished product, whereby a finished product is obtained.

12. The method according to claim 11, wherein method step c) is commenced 1 day to 30 days after method step b) is finished.

13. The method according to claim 11, wherein step c) is conducted at a temperature of 200 °C to 250 °C.

14. A copper clad laminate or printed circuit board comprising the finished product obtained according to claim 11.

15. The method according to claim 7, wherein the polymerizable composition is free from isocyanate-reactive groups.

16. The polymerizable composition according to claim 1, wherein the polymerizable composition comprises at least one aliphatic polyisocyanate consisting to an extent of at least 99% by weight of aliphatic oligomeric polyisocyanate, based on total weight of aliphatic polyisocyanate, and at least one cycloaliphatic polyisocyanate consisting to an extent of at least 99% by weight of cycloaliphatic oligomeric polyisocyanate, based in total weight of cycloaliphatic polyisocyanate.

17. The method according to claim 7, wherein the polymerizable composition comprises at least one aliphatic polyisocyanate consisting to an extent of at least 99% by weight of aliphatic oligomeric polyisocyanate, based on total weight of aliphatic polyisocyanate, and at least one cycloaliphatic polyisocyanate consisting to an extent of at least 99% by weight of cycloaliphatic oligomeric polyisocyanate, based in total weight of cycloaliphatic polyisocyanate.

* * * * *